(12) United States Patent
Anthony et al.

(10) Patent No.: US 7,042,703 B2
(45) Date of Patent: May 9, 2006

(54) ENERGY CONDITIONING STRUCTURE

(75) Inventors: Anthony Anthony, Erie, PA (US);
William Anthony, Erie, PA (US)

(73) Assignee: X2Y Attenuators, LLC, Erie, PA (US)

(*) Notice: Subject to any disclaimer, the term of this patent is extended or adjusted under 35 U.S.C. 154(b) by 206 days.

(21) Appl. No.: 10/435,199

(22) Filed: May 12, 2003

(65) Prior Publication Data

US 2003/0231456 A1 Dec. 18, 2003

Related U.S. Application Data

(63) Continuation-in-part of application No. 10/190,889, filed on Jul. 8, 2002, now Pat. No. 6,563,688, which is a continuation-in-part of application No. 09/815,246, filed on Mar. 22, 2001, now Pat. No. 6,469,595

(60) Provisional application No. 60/191,196, filed on Mar. 22, 2000, provisional application No. 60/200,327, filed on Apr. 28, 2000, provisional application No. 60/215,314, filed on Jun. 30, 2000, and provisional application No. 60/225,497, filed on Aug. 15, 2000.

(51) Int. Cl.
*H01G 4/35* (2006.01)

(52) U.S. Cl. .................. 361/302; 361/301.2; 361/301.4; 361/303; 361/305; 361/328; 333/182; 333/184; 333/185

(58) Field of Classification Search ................ 361/302, 361/303, 305, 301.2, 301.4, 309, 306.3, 321.1, 361/311, 313, 328; 332/182, 184, 185
See application file for complete search history.

(56) References Cited

U.S. PATENT DOCUMENTS

| | | | |
|---|---|---|---|
| 3,240,621 A | 3/1966 | Flower, Jr. et al. | |
| 3,343,034 A | 9/1967 | Ovshinsky | |
| 3,573,677 A | 4/1971 | Detar | |
| 3,742,420 A | 6/1973 | Harnden, Jr. | |
| 3,790,858 A | 2/1974 | Brancaleone et al. | |
| 3,842,374 A | 10/1974 | Schlicke | |
| 4,023,071 A | 5/1977 | Fussell | |

(Continued)

FOREIGN PATENT DOCUMENTS

| | | |
|---|---|---|
| DE | 197 28 692 A1 | 1/1999 |
| DE | 198 57 043 C1 | 3/2000 |
| EP | 0933871 | 8/1999 |
| EP | 1022751 | 7/2000 |
| EP | 1024507 | 8/2000 |
| EP | 1061535 | 12/2000 |
| FR | 2765417 | 12/1998 |

(Continued)

OTHER PUBLICATIONS

International application No. PCT/US01/09185, Mar. 22, 2001 published as WO2001-071908.*
PCT International Search Report for International Application No. PCT/US01/09185 Jun. 13, 2001.
Oct. 1, 2002, PCT International Search Report for PCT/US01/48861.
Jan. 2, 2003, PCT International Search Report for PCT/US01/44681.
Jan. 1, 1994, Greb, "An Intuitive Approach to EM Fields," EMC Test & Design, Jan. 1991, pp. 30–33.

(Continued)

*Primary Examiner*—Anthony Dinkins
*Assistant Examiner*—Nguyen T. Ha
(74) *Attorney, Agent, or Firm*—Neifeld IP Law, PC

(57) ABSTRACT

An energy conditioning structure comprised of any combination of multilayer or monolithic energy conditioners with operable conductors, all selectively arranged and shielded for attachment to at least a conductive substrate.

32 Claims, 2 Drawing Sheets

U.S. PATENT DOCUMENTS

| | | | |
|---|---|---|---|
| 4,135,132 A | 1/1979 | Tafjord | |
| 4,139,783 A | 2/1979 | Engeler | |
| 4,191,986 A | 3/1980 | ta Huang et al. | |
| 4,198,613 A | 4/1980 | Whitley | |
| 4,259,604 A | 3/1981 | Aoki | |
| 4,262,317 A | 4/1981 | Baumbach | |
| 4,275,945 A | 6/1981 | Krantz et al. | |
| 4,292,558 A | 9/1981 | Flick et al. | |
| 4,308,509 A | 12/1981 | Tsuchiya et al. | |
| 4,320,364 A | 3/1982 | Sakamoto et al. | |
| 4,335,417 A | 6/1982 | Sakshaug et al. | |
| 4,353,044 A | 10/1982 | Nossek | |
| 4,366,456 A | 12/1982 | Ueno et al. | |
| 4,384,263 A | 5/1983 | Neuman et al. | |
| 4,394,639 A | 7/1983 | McGalliard | |
| 4,412,146 A | 10/1983 | Futterer et al. | |
| 4,533,931 A | 8/1985 | Mandai et al. | |
| 4,553,114 A | 11/1985 | English et al. | |
| 4,563,659 A | 1/1986 | Sakamoto | |
| 4,586,104 A | 4/1986 | Standler | |
| 4,587,589 A | 5/1986 | Marek | |
| 4,590,537 A | 5/1986 | Sakamoto | |
| 4,612,140 A | 9/1986 | Mandai | |
| 4,612,497 A | 9/1986 | Ulmer | |
| 4,636,752 A | 1/1987 | Saito | |
| 4,682,129 A | 7/1987 | Bakermans et al. | |
| 4,685,025 A | 8/1987 | Carlomagno | |
| 4,688,151 A | 8/1987 | Kraus et al. | |
| 4,694,265 A | 9/1987 | Kupper | |
| 4,698,721 A | 10/1987 | Warren | |
| 4,703,386 A | 10/1987 | Speet et al. | |
| 4,713,540 A | 12/1987 | Gilby et al. | |
| 4,720,760 A | 1/1988 | Starr | |
| 4,746,557 A | 5/1988 | Sakamoto et al. | |
| 4,752,752 A | 6/1988 | Okubo | |
| 4,760,485 A | 7/1988 | Ari et al. | |
| 4,772,225 A | 9/1988 | Ulery | |
| 4,777,460 A | 10/1988 | Okubo | |
| 4,780,598 A | 10/1988 | Fahey et al. | |
| 4,782,311 A | 11/1988 | Okubo | |
| 4,789,847 A | 12/1988 | Sakamoto et al. | |
| 4,794,485 A | 12/1988 | Bennett | |
| 4,794,499 A | 12/1988 | Ott | |
| 4,795,658 A | 1/1989 | Kano et al. | |
| 4,799,070 A | 1/1989 | Nishikawa | |
| 4,801,904 A | 1/1989 | Sakamoto et al. | |
| 4,814,295 A | 3/1989 | Mehta | |
| 4,814,938 A * | 3/1989 | Arakawa et al. | 361/302 |
| 4,814,941 A | 3/1989 | Speet et al. | |
| 4,819,126 A | 4/1989 | Kornrumpf et al. | |
| 4,845,606 A | 7/1989 | Herbert | |
| 4,847,730 A | 7/1989 | Konno et al. | |
| 4,904,967 A | 2/1990 | Morii et al. | |
| 4,908,586 A | 3/1990 | Kling et al. | |
| 4,908,590 A | 3/1990 | Sakamoto et al. | |
| 4,924,340 A | 5/1990 | Sweet | |
| 4,942,353 A | 7/1990 | Herbert et al. | |
| 4,967,315 A | 10/1990 | Schelhorn | |
| 4,978,906 A | 12/1990 | Herbert et al. | |
| 4,990,202 A | 2/1991 | Murata et al. | |
| 4,999,595 A | 3/1991 | Azumi et al. | |
| 5,034,709 A | 7/1991 | Azumi et al. | |
| 5,034,710 A | 7/1991 | Kawaguchi | |
| 5,051,712 A | 9/1991 | Naito et al. | |
| 5,059,140 A | 10/1991 | Philippson et al. | |
| 5,065,284 A | 11/1991 | Hernandez | |
| 5,073,523 A | 12/1991 | Yamada et al. | |
| 5,079,069 A | 1/1992 | Howard et al. | |
| 5,079,223 A | 1/1992 | Maroni | |
| 5,079,669 A | 1/1992 | Williams | |
| 5,089,688 A | 2/1992 | Fang et al. | |
| 5,105,333 A | 4/1992 | Yamano et al. | |
| 5,107,394 A | 4/1992 | Naito et al. | |
| 5,109,206 A | 4/1992 | Carlile | |
| 5,140,297 A | 8/1992 | Jacobs et al. | |
| 5,140,497 A | 8/1992 | Kato et al. | |
| 5,142,430 A | 8/1992 | Anthony | |
| 5,148,005 A | 9/1992 | Fang et al. | |
| 5,155,655 A | 10/1992 | Howard et al. | |
| 5,161,086 A | 11/1992 | Howard et al. | |
| 5,167,483 A | 12/1992 | Gardiner | |
| 5,173,670 A | 12/1992 | Naito et al. | |
| 5,179,362 A | 1/1993 | Okochi et al. | |
| 5,181,859 A | 1/1993 | Foreman et al. | |
| 5,186,647 A | 2/1993 | Denkmann et al. | |
| 5,208,502 A | 5/1993 | Yamashita et al. | |
| 5,219,812 A | 6/1993 | Doi et al. | |
| 5,220,480 A | 6/1993 | Kershaw, Jr. et al. | |
| 5,236,376 A | 8/1993 | Cohen | |
| 5,243,308 A | 9/1993 | Shusterman et al. | |
| 5,251,092 A | 10/1993 | Brady et al. | |
| 5,261,153 A | 11/1993 | Lucas | |
| 5,262,611 A | 11/1993 | Danysh et al. | |
| 5,268,810 A | 12/1993 | DiMarco et al. | |
| 5,290,191 A | 3/1994 | Foreman et al. | |
| 5,299,956 A | 4/1994 | Brownell et al. | |
| 5,300,760 A | 4/1994 | Batliwalla et al. | |
| 5,310,363 A | 5/1994 | Brownell et al. | |
| 5,311,408 A | 5/1994 | Ferchau et al. | |
| 5,321,373 A | 6/1994 | Shusterman et al. | |
| 5,321,573 A | 6/1994 | Person et al. | |
| 5,326,284 A | 7/1994 | Bohbot et al. | |
| 5,337,028 A | 8/1994 | White | |
| 5,353,189 A | 10/1994 | Tomlinson | |
| 5,353,202 A | 10/1994 | Ansell et al. | |
| 5,357,568 A | 10/1994 | Pelegris | |
| 5,362,249 A | 11/1994 | Carter | |
| 5,362,254 A | 11/1994 | Siemon et al. | |
| 5,378,407 A | 1/1995 | Chandler et al. | |
| 5,382,938 A | 1/1995 | Hansson et al. | |
| 5,396,201 A | 3/1995 | Ishizaki et al. | |
| 5,401,952 A | 3/1995 | Sugawa | |
| 5,405,466 A | 4/1995 | Naito et al. | |
| 5,414,393 A | 5/1995 | Rose et al. | |
| 5,414,587 A | 5/1995 | Kiser et al. | |
| 5,432,484 A | 7/1995 | Klas et al. | |
| 5,446,625 A | 8/1995 | Urbish et al. | |
| 5,450,278 A | 9/1995 | Lee et al. | |
| 5,451,919 A | 9/1995 | Chu et al. | |
| RE35,064 E | 10/1995 | Hernandez | |
| 5,455,734 A | 10/1995 | Foreman et al. | |
| 5,461,351 A | 10/1995 | Shusterman | |
| 5,463,232 A | 10/1995 | Yamashita et al. | |
| 5,471,035 A | 11/1995 | Holmes | |
| 5,477,933 A | 12/1995 | Nguyen | |
| 5,481,238 A | 1/1996 | Carsten et al. | |
| 5,483,407 A | 1/1996 | Anastasio et al. | |
| 5,488,540 A | 1/1996 | Hatta | |
| 5,491,299 A | 2/1996 | Naylor et al. | |
| 5,493,260 A | 2/1996 | Park | |
| 5,495,180 A | 2/1996 | Huang et al. | |
| 5,500,629 A | 3/1996 | Meyer | |
| 5,500,785 A | 3/1996 | Funada | |
| 5,512,196 A | 4/1996 | Mantese et al. | |
| 5,531,003 A * | 7/1996 | Seifried et al. | 29/25.42 |
| 5,534,837 A | 7/1996 | Brandt | |
| 5,535,101 A | 7/1996 | Miles et al. | |
| 5,536,978 A | 7/1996 | Cooper et al. | |
| 5,541,482 A | 7/1996 | Siao | |
| 5,544,002 A * | 8/1996 | Iwaya et al. | 361/302 |
| 5,546,058 A * | 8/1996 | Azuma et al. | 333/183 |

| | | |
|---|---|---|
| 5,555,150 A | 9/1996 | Newman, Jr. |
| 5,568,348 A | 10/1996 | Foreman et al. |
| 5,570,278 A | 10/1996 | Cross |
| 5,583,359 A | 12/1996 | Ng et al. |
| 5,586,007 A | 12/1996 | Funada |
| 5,592,391 A | 1/1997 | Muyshondt et al. |
| 5,612,657 A | 3/1997 | Kledzik |
| 5,614,881 A | 3/1997 | Duggal et al. |
| 5,619,079 A | 4/1997 | Wiggins et al. |
| 5,624,592 A | 4/1997 | Paustian |
| 5,640,048 A | 6/1997 | Selna |
| 5,645,746 A | 7/1997 | Walsh |
| 5,647,766 A | 7/1997 | Nguyen |
| 5,668,511 A | 9/1997 | Furutani et al. |
| 5,682,303 A | 10/1997 | Goad |
| 5,700,167 A | 12/1997 | Pharney et al. |
| 5,708,553 A | 1/1998 | Hung |
| 5,719,450 A | 2/1998 | Vora |
| 5,719,477 A | 2/1998 | Tomihari |
| 5,719,750 A | 2/1998 | Iwane |
| 5,751,539 A | 5/1998 | Stevenson et al. |
| 5,767,446 A | 6/1998 | Ha et al. |
| 5,789,999 A | 8/1998 | Barnett et al. |
| 5,790,368 A | 8/1998 | Naito et al. |
| 5,796,568 A | 8/1998 | Baiatu |
| 5,796,595 A | 8/1998 | Cross |
| 5,797,770 A | 8/1998 | Davis et al. |
| 5,808,873 A | 9/1998 | Celaya et al. |
| 5,825,628 A | 10/1998 | Garbelli et al. |
| 5,828,093 A | 10/1998 | Naito et al. |
| 5,828,272 A | 10/1998 | Romerein et al. |
| 5,828,555 A | 10/1998 | Itoh |
| 5,831,489 A | 11/1998 | Wire |
| 5,834,992 A | 11/1998 | Kato et al. |
| 5,838,216 A | 11/1998 | White et al. |
| 5,867,361 A | 2/1999 | Wolf et al. |
| 5,870,272 A | 2/1999 | Seifried et al. |
| 5,875,099 A | 2/1999 | Maesaka et al. |
| 5,880,925 A | 3/1999 | DuPre et al. |
| 5,889,445 A | 3/1999 | Ritter et al. |
| 5,895,990 A | 4/1999 | Lau |
| 5,898,403 A | 4/1999 | Saitoh et al. |
| 5,898,562 A | 4/1999 | Cain et al. |
| 5,905,627 A | 5/1999 | Brendel et al. |
| 5,907,265 A | 5/1999 | Sakuragawa et al. |
| 5,908,151 A | 6/1999 | Elias |
| 5,909,155 A | 6/1999 | Anderson et al. |
| 5,909,350 A | 6/1999 | Anthony |
| 5,910,755 A | 6/1999 | Mishiro et al. |
| 5,912,809 A | 6/1999 | Steigerwald et al. |
| 5,917,388 A | 6/1999 | Tronche et al. |
| 5,926,377 A | 7/1999 | Nakao et al. |
| 5,928,076 A | 7/1999 | Clements et al. |
| 5,955,930 A | 9/1999 | Anderson et al. |
| 5,959,829 A | 9/1999 | Stevenson et al. |
| 5,959,846 A | 9/1999 | Noguchi et al. |
| 5,969,461 A | 10/1999 | Anderson et al. |
| 5,977,845 A | 11/1999 | Kitahara |
| 5,978,231 A | 11/1999 | Tohya et al. |
| 5,980,718 A | 11/1999 | Van Konynenburg et al. |
| 5,995,352 A | 11/1999 | Gumley |
| 5,999,067 A | 12/1999 | D'Ostilio |
| 5,999,398 A * | 12/1999 | Makl et al. ................. 361/302 |
| 6,004,752 A | 12/1999 | Loewy et al. |
| 6,013,957 A | 1/2000 | Puzo et al. |
| 6,016,095 A | 1/2000 | Herbert |
| 6,018,448 A | 1/2000 | Anthony |
| 6,021,564 A | 2/2000 | Hanson |
| 6,023,406 A | 2/2000 | Kinoshita et al. |
| 6,031,710 A | 2/2000 | Wolf et al. |
| 6,034,576 A | 3/2000 | Kuth |
| 6,034,864 A | 3/2000 | Naito et al. |
| 6,037,846 A | 3/2000 | Oberhammer |
| 6,038,121 A | 3/2000 | Naito et al. |
| 6,046,898 A | 4/2000 | Seymour et al. |
| 6,052,038 A | 4/2000 | Savicki |
| 6,061,227 A | 5/2000 | Nogi |
| 6,064,286 A | 5/2000 | Ziegner et al. |
| 6,072,687 A | 6/2000 | Naito et al. |
| 6,075,211 A | 6/2000 | Tohya et al. |
| 6,078,117 A | 6/2000 | Perrin et al. |
| 6,078,229 A | 6/2000 | Funada et al. |
| 6,088,235 A | 7/2000 | Chiao et al. |
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A | 8/2000 | Anthony |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,231 B1 | 1/2001 | Bartilson |
| 6,183,685 B1 | 2/2001 | Cowman et al. |
| 6,185,091 B1 | 2/2001 | Tanahashi et al. |
| 6,188,565 B1 | 2/2001 | Naito et al. |
| 6,191,475 B1 | 2/2001 | Skinner et al. |
| 6,191,669 B1 | 2/2001 | Shigemura |
| 6,191,932 B1 | 2/2001 | Kuroda et al. |
| 6,195,269 B1 | 2/2001 | Hino |
| 6,198,123 B1 | 3/2001 | Linder et al. |
| 6,198,362 B1 | 3/2001 | Harada et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,078 B1 | 4/2001 | Hunt et al. |
| 6,215,647 B1 | 4/2001 | Naito et al. |
| 6,215,649 B1 | 4/2001 | Appelt et al. |
| 6,218,631 B1 | 4/2001 | Hetzel et al. |
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 * | 5/2001 | Akino et al. ................. 333/182 |
| 6,226,169 B1 | 5/2001 | Naito et al. |

| | | | | | | |
|---|---|---|---|---|---|---|
| 6,226,182 | B1 | 5/2001 | Maehara | 2001/0023983 A1 | 9/2001 | Kobayashi et al. |
| 6,229,226 | B1 | 5/2001 | Kramer et al. | 2001/0024148 A1 | 9/2001 | Gerstenberg et al. |
| 6,236,572 | B1 | 5/2001 | Teshome et al. | 2001/0028581 A1 | 10/2001 | Yanagisawa et al. |
| 6,240,621 | B1 | 6/2001 | Nellissen et al. | 2001/0029648 A1 | 10/2001 | Ikada et al. |
| 6,243,253 | B1 | 6/2001 | DuPre et al. | 2001/0031191 A1 | 10/2001 | Korenaga |
| 6,249,047 | B1 | 6/2001 | Corisis | 2001/0033664 A1 | 10/2001 | Poux et al. |
| 6,249,439 | B1 | 6/2001 | DeMore et al. | 2001/0035801 A1 | 11/2001 | Gilbert |
| 6,252,161 | B1 | 6/2001 | Hailey et al. | 2001/0035802 A1 | 11/2001 | Kadota |
| 6,262,895 | B1 | 7/2001 | Forthun | 2001/0035805 A1 | 11/2001 | Suzuki et al. |
| 6,266,228 | B1 | 7/2001 | Naito et al. | 2001/0037680 A1 | 11/2001 | Buck et al. |
| 6,266,229 | B1 | 7/2001 | Naito et al. | 2001/0039834 A1 | 11/2001 | Hsu |
| 6,272,003 | B1 | 8/2001 | Schaper | 2001/0040484 A1 | 11/2001 | Kim |
| 6,282,074 | B1 | 8/2001 | Anthony | 2001/0040487 A1 | 11/2001 | Ikada et al. |
| 6,282,079 | B1 | 8/2001 | Nagakari et al. | 2001/0040488 A1 | 11/2001 | Gould et al. |
| 6,285,109 | B1 | 9/2001 | Katagiri et al. | 2001/0041305 A1 | 11/2001 | Sawada et al. |
| 6,285,542 | B1 | 9/2001 | Kennedy, III et al. | 2001/0043100 A1 | 11/2001 | Tomita et al. |
| 6,292,350 | B1 | 9/2001 | Naito et al. | 2001/0043129 A1 | 11/2001 | Hidaka et al. |
| 6,292,351 | B1 | 9/2001 | Ahiko et al. | 2001/0043450 A1 | 11/2001 | Seale et al. |
| 6,309,245 | B1 | 10/2001 | Sweeney | 2001/0043453 A1 | 11/2001 | Narwankar et al. |
| 6,310,286 | B1 | 10/2001 | Troxel et al. | 2001/0045810 A1 | 11/2001 | Poon et al. |
| 6,313,584 | B1 | 11/2001 | Johnson et al. | 2001/0048581 A1 | 12/2001 | Anthony et al. |
| 6,320,547 | B1 | 11/2001 | Fathy et al. | 2001/0048593 A1 | 12/2001 | Yamauchi et al. |
| 6,324,047 | B1 | 11/2001 | Hayworth | 2001/0048906 A1 | 12/2001 | Lau et al. |
| 6,324,048 | B1 | 11/2001 | Liu | 2001/0050550 A1 | 12/2001 | Yoshida et al. |
| 6,325,672 | B1 | 12/2001 | Belopolsky et al. | 2001/0050600 A1 | 12/2001 | Anthony et al. |
| 6,327,134 | B1 | 12/2001 | Kuroda et al. | 2001/0050837 A1 | 12/2001 | Stevenson et al. |
| 6,327,137 | B1 | 12/2001 | Yamomoto et al. | 2001/0052833 A1 | 12/2001 | Enokihara et al. |
| 6,331,926 | B1 | 12/2001 | Anthony | 2001/0054512 A1 | 12/2001 | Belau et al. |
| 6,331,930 | B1 | 12/2001 | Kuroda | 2001/0054734 A1 | 12/2001 | Koh et al. |
| 6,342,681 | B1 | 1/2002 | Goldberger et al. | 2001/0054756 A1 | 12/2001 | Horiuchi et al. |
| 6,373,673 | B1 | 4/2002 | Anthony | 2001/0054936 A1 | 12/2001 | Okada et al. |
| 6,388,856 | B1 | 5/2002 | Anthony | 2002/0000521 A1 | 1/2002 | Brown |
| 6,456,481 | B1 | 9/2002 | Stevenson | 2002/0000583 A1 | 1/2002 | Kitsukawa et al. |
| 6,469,595 | B1 | 10/2002 | Anthony et al. | 2002/0000821 A1 | 1/2002 | Haga et al. |
| 6,498,710 | B1 | 12/2002 | Anthony | 2002/0000893 A1 | 1/2002 | Hidaka et al. |
| 6,509,807 | B1 | 1/2003 | Anthony et al. | 2002/0000895 A1 | 1/2002 | Yakahashi et al. |
| 6,510,038 | B1 * | 1/2003 | Satou et al. ............ 361/302 | 2002/0003454 A1 | 1/2002 | Sweeney et al. |
| 6,522,516 | B1 | 2/2003 | Anthony | 2002/0005880 A1 | 1/2002 | Ashe et al. |
| 6,549,389 | B1 * | 4/2003 | Anthony et al. ........... 361/117 | 2002/0075096 A1 | 6/2002 | Anthony |
| 6,563,688 | B1 | 5/2003 | Anthony et al. | 2003/0048029 A1 | 3/2003 | DeDaran et al. |
| 6,580,595 | B1 | 6/2003 | Anthony et al. | 2003/0067730 A1 | 4/2003 | Anthony et al. |
| 6,594,128 | B1 | 7/2003 | Anthony | | | |
| 6,603,646 | B1 | 8/2003 | Anthony et al. | FOREIGN PATENT DOCUMENTS | | |
| 6,606,011 | B1 | 8/2003 | Anthony et al. | FR | 2808135 | 10/2001 |
| 6,606,237 | B1 | 8/2003 | Naito et al. | GB | 2217136 | 4/1988 |
| 6,618,268 | B1 | 9/2003 | Dibene, II et al. | JP | 63-269509 | 11/1988 |
| 6,636,406 | B1 | 10/2003 | Anthony | JP | 63-269509 A | 11/1988 |
| 6,650,525 | B1 | 11/2003 | Anthony | JP | 63269509 * | 12/1988 |
| 6,687,108 | B1 | 2/2004 | Anthony et al. | JP | 1-27251 | 1/1989 |
| 6,717,301 | B1 | 4/2004 | DeDaran et al. | JP | 02-267879 | 11/1990 |
| 2001/0001989 | A1 | 5/2001 | Smith | JP | 2-267879 A | 11/1990 |
| 2001/0002105 | A1 | 5/2001 | Brandelik et al. | JP | 03-018112 | 1/1991 |
| 2001/0002624 | A1 | 6/2001 | Khandros et al. | JP | 5-283284 | 10/1993 |
| 2001/0008288 | A1 | 7/2001 | Kimura et al. | JP | 06-053048 | 2/1994 |
| 2001/0008302 | A1 | 7/2001 | Murakami et al. | JP | 06-053049 | 2/1994 |
| 2001/0008478 | A1 | 7/2001 | McIntosh et al. | JP | 06-053075 | 2/1994 |
| 2001/0008509 | A1 | 7/2001 | Watanabe | JP | 06-053077 | 2/1994 |
| 2001/0009496 | A1 | 7/2001 | Kappel et al. | JP | 06-053078 | 2/1994 |
| 2001/0010444 | A1 | 8/2001 | Pahl et al. | JP | 06-084695 | 3/1994 |
| 2001/0011763 | A1 | 8/2001 | Ushijima et al. | JP | 06-151014 | 5/1994 |
| 2001/0011934 | A1 | 8/2001 | Yamamoto | JP | 06-151244 | 5/1994 |
| 2001/0011937 | A1 | 8/2001 | Satoh et al. | JP | 06-151245 | 5/1994 |
| 2001/0013626 | A1 | 8/2001 | Fujii | JP | 06-325977 | 11/1994 |
| 2001/0015643 | A1 | 8/2001 | Goldfine et al. | JP | 07-235406 | 9/1995 |
| 2001/0015683 | A1 | 8/2001 | Mikami et al. | JP | 07-235852 | 9/1995 |
| 2001/0017576 | A1 | 8/2001 | Kondo et al. | JP | 07-240651 | 9/1995 |
| 2001/0017579 | A1 | 8/2001 | Kurata | JP | 08-124795 | 5/1996 |
| 2001/0019869 | A1 | 9/2001 | Hsu | JP | 08-163122 | 6/1996 |
| 2001/0020879 | A1 | 9/2001 | Takahashi et al. | JP | 08-172025 | 7/1996 |
| 2001/0021097 | A1 | 9/2001 | Ohya et al. | JP | 09-284077 | 10/1997 |
| 2001/0022547 | A1 | 9/2001 | Murata et al. | JP | 09-284078 | 10/1997 |

| | | |
|---|---|---|
| JP | 9-294041 | 11/1997 |
| JP | 11-21456 | 8/1999 |
| JP | 11-214256 | 8/1999 |
| JP | 11-223396 | 8/1999 |
| JP | 11-294908 | 10/1999 |
| JP | 11-305302 | 11/1999 |
| JP | 11-319222 | 11/1999 |
| JP | 11-345273 | 12/1999 |
| WO | WO 91/15046 | 10/1991 |
| WO | WO91/15046 | 10/1991 |
| WO | WO 98/45921 | 10/1998 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO00/16446 | 3/2000 |
| WO | WO 00/65740 | 11/2000 |
| WO | WO 00/74197 | 12/2000 |
| WO | WO 00/77907 | 12/2000 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/33798 | 4/2002 |
| WO | WO 02/1227794 | 4/2002 |
| WO | WO 02/45233 | 6/2002 |
| WO | WO 02/65606 | 8/2002 |
| WO | WO 02/080330 | 10/2002 |
| WO | WO 03/005541 | 1/2003 |
| WO | WO04/70905 | 8/2004 |
| WO | WO05/02018 | 1/2005 |
| WO | WO05/15719 | 2/2005 |
| WO | WO05/65097 | 7/2005 |

OTHER PUBLICATIONS

Greb, "An Intuitive Approach to EM Coupling," EMC Test & Design, Dec. 1, 1993, pp. 20–25.

Sakamoto, "Noisepro of Power Supplies: What's Important in EMI Removal Filters?" JEE, Jun. 1, 1986, pp. 80–85.

Montrose, "Analysis on Loop Area Trace Radiated Emissions from Decoupling Capacitor Placement on Printed Circuit Boards," IEEE, Jan. 1, 1999, pp. 423–428.

Miyoshi, "Surface Mounted Distributed Constant Type Noise Filter," IEEE, Jan. 1, 1999, pp. 157–160.

Shigeta et al., "Improved EMI Performance by Use of a Three–Terminal–Capacitor Applied to an IC Power Line," IEEE, Jan. 1, 1999, pp. 161–164.

Jul. 19, 1999, PCT International Search Report for PCT/US99/07653.

Oct. 13, 1999, IPER for PCT/US99/07653.

U.S. Appl. No. 10/479,506, Claims 1–46 from Preliminary Amendment filed Dec. 10, 2003.

U.S. Appl. No. 10/189,339, Claims 1–41 from Preliminary Amendment filed Oct. 28, 2003.

U.S. Appl. No. 10/443,792, Claims 1–41 from Preliminary Amendment filed Oct. 28, 2003.

Aug. 19, 1998, PCT International Search Report for PCT/US98/06962.

Apr. 19, 1999, PCT International Search Report for PCT/US99/01040.

Sep. 18, 2000, PCT International Search Report for PCT/US00/11409.

Sep. 13, 2000, PCT International Search Report for PCT/US00/14626.

Nov. 8, 2000, PCT International Search Report for PCT/US00/16518.

Dec. 28, 2000, PCT International Search Report for PCT/US00/21178.

Fang et al., "Conductive Polymers Prolong Circuit Life," Design News, date unknown, 3 pages.

Carpenter, Jr. et al., "A New Approach to TVSS Design," Power Quality Assurance, Sep./Oct. 1996 p. 60–63.

Raychem, "Polyswitch Resettable Fuses," Circuit Protection Databook, Jan. 1, 1996, pp. 11–18.

Dec. 28, 2001, PCT International Search Report for PCT/US01/41720.

Jun. 13, 2001, PCT International Search Report for PCT/US01/09185.

Polka et al., "Package–Level Interconnect Design for Optimum Electrical Performance," Intel Technology Journal, Q3, Jul. 1, 2000, pp. 1–17.

May 10, 2002, PCT International Search Report for PCT/US01/43418.

Mar. 13, 2002, PCT International Search Report for PCT/US01/32480.

Aug. 19, 2002, PCT International Search Report for PCT/US02/10302.

Feb. 28, 2003, PCT International Search Report for PCT/US02/21238.

Mar. 18, 2002, PCT International Search Report for PCT/US01/13911.

Jul. 16, 1991, PCT International Search Report for PCT/US91/02150.

Jun. 28, 2001, PCT International Search Report for PCT/US01/03792.

"Johanson Dielectrics, Inc. Licenses X2Y Circuit Conditioning Technology," Press Release, Dec. 16, 1998, 1 page.

Beyne et al., "PSGA—an innovative IC package for single and multichip designs," Components, Mar. 1, 1997, pp. 6–9.

"EMC Design for Brush Commutated DC Electric Motors," Sep. 15, 1997, pp. 1–2.

"Tomorrow's Capacitors," Components, Apr. 1, 1996, No. 4, p. 3.

Mason, "Valor—Understanding Common Mode Noise," Mar. 30, 1998, pp. 1–7.

Anthony Anthony et al., Pending specification, claims, figures for U.S. Appl. No. 10/237,079, Claims 21–81; filed Sep. 9, 2002.

David Anthony et al., Pending specification, claims, figures for U.S. Appl. No. 10/766,000, Claims 1–63; filed Jan. 29, 2004.

William Anthony, Pending specification, claims, figures for U.S. Appl. No. 10/399,630, Claims 1–35; filed Aug. 27, 2003.

Anthony Anthony et al., Pending specification, claims, figures for U.S. Appl. No. 10/432,840, Claims 1–39; filed May 28, 2003.

William Anthony, Pending specification, claims, figures for U.S. Appl. No. 10/443,482, Claims 1–25; filed Jun. 12, 2003.

Anthony Anthony et al., Pending specification, claims, figures for U.S. Appl. No. 10/435,199, Claims 1–32; filed May 12, 2003.

Anthony Anthony et al., Pending specification, claims, figures for U.S. Appl. No. 10/115,159, Claims 1–31; filed Apr. 2, 2002.
Anthony Anthony et al., Pending specification, claims, figures for U.S. Appl. No. 10/189,338, Claims 1–69; filed Jul. 2, 2002.
Anthony Anthony et al., Pending specification, claims, figures for U.S. Appl. No. 10/189,339, Claims 1–41; filed Jul. 2, 2002.
Anthony Anthony et al., Pending specification, claims, figures for U.S. Appl. No. 10/479,506, Claims 1–46; filed Dec. 10, 2003.
Anthony Anthony, Pending specification, claims, figures for U.S. Appl. No. 10/443,764, Claims 26–40; filed Sep. 16, 2003.
Anthony Anthony, Pending specification, claims, figures for U.S. Appl. No. 10/443,792, Claims 1–41; May 23, 2003.
Anthony Anthony, Pending specification, claims, figures for U.S. Appl. No. 10/443,788, Claims 1; 21–45; filed May 23, 2003.
Anthony Anthony et al., Pending specification, claims, figures for U.S. Appl. No. 10/443,778, Claims 1; 21–59; filed May 23, 2003.
Anthony Anthony et al., Pending specification, claims, figures for U.S. Appl. No. 10/460,361, Claims 1–16; filed Jun. 13, 2003.
Anthony Anthony et al., Pending specification, claims, figures for U.S. Appl. No. 10/705,962, Claims 1–18; filed Nov. 13, 2003.
Anthony Anthony, Pending specification, claims, figures for U.S. Appl. No. 10/369,335, Claims 1–20; filed Feb. 18, 2003.
Anthony Anthony et al., Pending specification, claims, figures for U.S. Appl. No. 09/647,648, Claims 1–48; filed Nov. 17, 2000.
Anthony Anthony, Pending specification, claims, figures for U.S. Appl. No. 10/328,942, Claims 1–20; filed Dec. 23, 2002.
Anthony Anthony et al., Pending specification, claims, figures for U.S. Appl. No. 09/632,048, Claims 1–20; filed Aug. 3, 2000.
Anthony Anthony et al., Pending specification, claims, figures for U.S. Appl. No. 09/996,355, Claims 1–73; filed Nov. 29, 2001.
Willian Anthony, Pending specification, claims, figures for U.S. Appl. No. 10/023,467, Claims 1–20; filed Dec. 17, 2001.
PCT International Search Report for PCT/US01/48861.
PCT International Search Report for PCT/US01/44681.
Greb, "An Intuitive Approach to EM Fields," EMC Test & Design, Jan. pp. 30–33.
Greb, "An Intuitive Approach to EM Coupling," EMC Test & Design, Dec. 1993, pp. 20–25.
Sakamoto, "Noiseproof Power Supplies: What's Important in EMI Removal Filters?" JEE, Jun. 1986, pp. 80–85.
Montrose, "Analysis on Loop Area Trace Radiated Emissons from Decoupling Capacitor Placement on Printed Circuit Boards," IEEE, 1999, pp. 423–428.
Miyoshi, "Surface Mounted Distributed Constant Type Noise Filter," IEEE, 1999, pp. 157–160.
Shigeta et al., "Improved EMI Performance by Use of a Three–Terminal–Capacitor Applied to an IC Power Line," IEEE, 1999, pp. 161–164.
PCT International Search Report for PCT/US99/07653.
IPER for PCT/US99/07653.
U.S. Appl. No. 10/479,506, Claims 1–46 from Preliminary Amendment filed Dec. 10, 2003.
U.S. Appl. No. 10/189,339, Claims 1–41 from Preliminary Amendent filed Oct. 28, 2003.
U.S. Appl. No. 10/443,792, Claims 1–41 from Preliminary Amendent filed Oct. 28, 2003.
PCT International Search Report for PCT/US98/06962.
PCT International Search Report for PCT/US99/01040.

* cited by examiner

ENERGY CONDITIONING STRUCTURE

CROSS REFERENCE TO RELATED APPLICATIONS

This application is a continuation-in-part of application No. 10/190,889 filed Jul. 8, 2002, now U.S. Pat. No. 6,563,688, which is a continuation-in-part of co-pending application No. 09/815,246 filed Mar. 22, 2001, now U.S. Pat. No. 6,469,595, and application Ser. No. 09/815,246 filed Mar. 22, 2001 claims the benefit of U.S. provisional application 60/191,196 filed Mar. 22, 2000, provisional application 60/200,327 filed Apr. 28, 2000, provisional application 60/215,314 filed Jun. 30, 2000, and provisional application 60/225,497 filed Aug. 15, 2000.

TECHNICAL FIELD

This invention relates to a multi-functional energy conditioner whose physical architecture suppresses unwanted electromagnetic emissions, both those received from other sources and those created internally within electronic circuitry by differential and common mode currents. In addition, over voltage surge protection and magnetic properties are integrally incorporated with the ability of differential and common mode filtering, dependant upon circuit attachment arrangement.

BACKGROUND OF THE INVENTION

Today, as the density of electronics within typical system applications increases, unwanted noise byproducts of the increased density limit the performance of critical and non-critical electronic circuitry. Consequently, the avoidance of the effects of unwanted noise byproducts, such as by isolation or immunization of circuit portions against the effects of the undesirable noise is an important consideration for most circuit arrangements and circuit design.

Differential and common mode noise energy can be generated by, and may propagate along and/or around, energy pathways, cables, circuit board tracks or traces, high-speed transmission lines, and/or bus line pathways. In many cases, these energy conductors may act as, for example, an antenna radiating energy fields. This antenna-analogous performance may exacerbate the noise byproduct problem in that, at higher frequencies, propagating energy portions utilizing prior art passive devices may experience increased levels of energy parasitic interference, such as various capacitive and/or inductive parasitics. These increases can be due, in part, to the combination of constraints due to the functionally and/or structurally limitations of prior art solutions, coupled with the inherent manufacturing and/or design imbalances and/or performance deficiencies of the prior art. These deficiencies inherently create, or induce, operability highly conducive to unwanted and/or unbalanced interference energy that couples into an associated electrical circuitry, thereby making at least partial shielding from these parasitics and EMI desirable.

Consequently, for broad frequency operating environments, solution of these problems necessitates at least a combination of simultaneous filtration of energy propagation pathways, careful systems layout having various grounding or anti-noise arrangements.

Thus, a need exists for an energy conditioning structure that can provide for a wide range of energy conditioning abilities utilizing common energy conditioning components that are amalgamated into a filter that incorporates a larger conductive area of substrate. The structure creates, by arranging materials into a multiple, energy pathway system or filter structure operable to accommodate today's EMI/EMC requirements as well as industry economics.

DETAILED DESCRIPTION OF THE PREFERRED EMBODIMENTS

Figure 1:
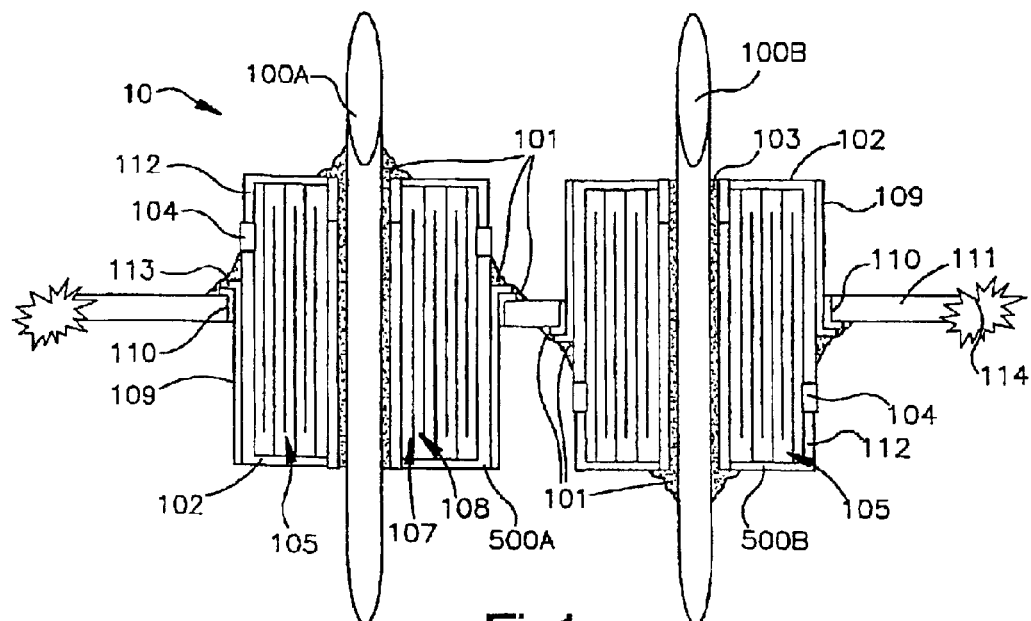
FIG. 1 is a cross-sectional side view of filter 10 comprising complementary multilayer energy conditioners arranged in a conductive substrate assembly and located on opposite sides of a grounding configuration in accordance with the present invention.

In electricity it is common for various interactions and interrelationships between energy propagations to be described in terms of their complementary dynamics brought about by pairs or pairings of energy portion elements with opposing energies and forces that are interacting from a charged-polarized opposition or electrically opposite, but electrically complementary state to each other.

The interactions that are described herein as dynamic events, in complementary balance, occur by symmetry of pairings and are happening simultaneously, with the same or complementary, mirror-like, reverse positioning of elements such that certain timings of events occur, or are made with the understanding that the one skilled in the art is aware that man-made tolerances and/or limitations used to described or record certain dynamics, while usually done in terms of exacting words or wording meanings, will not always have full applicability to fully describe the matter at hand within the lexicon in the disclosure.

Use of the such words as same, 'complementary', 'simultaneous', 'same-time, same size, same sized, identical, equal, equal-sized', etc. should be understood with the preciseness of the real world, as to what the words mean or are relied upon to convey for explanation the general understanding to what is considered a norm and/or a standard, especially as well, to what is as practicable for standard manufacturing tolerances as normally practice within the state of the art.

The invention is created when components are placed and combined in o a filter operable for complementary or differential energy conditioning along circuit pathways electrically connected (but electrically isolated from one another) to at least a source of energy and a load. These complementary or multiple-complementary elements such as conductive pin electrodes are considered herein as energy conductors 100A and 100B, which are combined and amalgamated either before or after, with tubular-shaped or shaped elements of conditioners 500 (including for example 500A and 500B) and 600 (including for example 600A and 600B) that will or have been selectively coupled with sleeve 109.

It should be noted that the shape disclosed here is not limited to tubular-shaped, but rather as long as the conductive elements of the conditioner are similar to obtain substantially the same filtering effect, any shaped conditioner can be used. This includes other embodiments, such as types of capacitive/inductive elements, namely multi-layered, shaped-capacitors 500 or monolithic, shaped-capacitors 600 respectively, to form a single energy conditioner, each, respectively, that are then both placed into paired, but physically opposing or complementary positions in relation to one another from an angle that can be varied from 1 degree complementary up to 180 degree complementary, but specifically preferred embodiments should be conductively coupled to opposite sides of a conductive substrate 111, plane or area regardless of the angle of attachment location.

When the filter is energized within a circuit, conductive substrate 111 can be selectively attached by amalgamated elements to create alone or with an external conductive area, a voltage reference node that is operable for this circuit that has at least an energy source and a load. The conductive substrate 111 with or without external conductive area (not shown) can also serve as at least a low impedance path for portions of propagating energies to move that is not connected electrically to either the source of the load within the circuit just described. It should be noted that conductive substrate 111 is not limited to being entirely conductive, only that it comprise at least a conductive area.

Thus, the filter is practicable for such functions as physically opposing and electrically complementary energy field portion cancellations and/or suppressions, cancellations of mutually coupled inductance fields as well as substantial elimination and/or prevention of ground bounce and cross talk between the differential lines in terms of cross-talk and the between each differential unit and the low impedance energy pathway in terms of ground bounce blocking and prevention.

Figure 2:
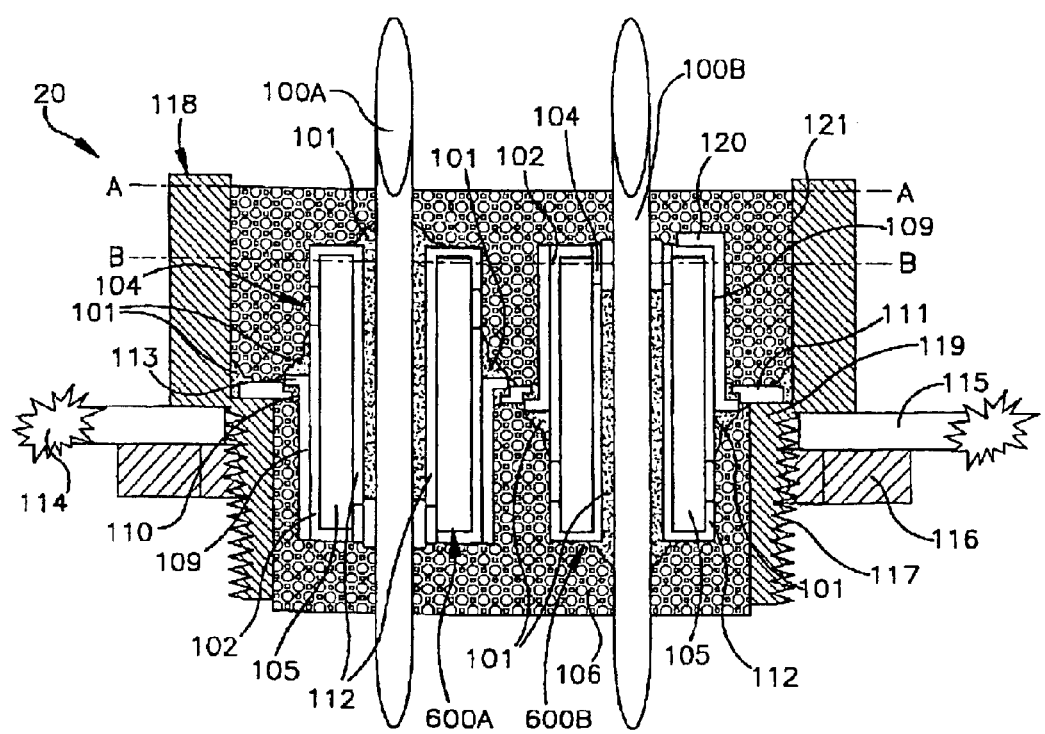
FIG. 2 is a cross-sectional side view of filter 20 comprised of complementary monolithic energy conditioners arranged in a conductive substrate assembly and located on opposite sides of a grounding configuration now placed in a connector assembly called filter assembly 30 in accordance with the present invention.

Complementary energy conditioners such as 500A and 500B and 600A and 600B of FIGS. 1 and 2 are separated physically from one another on either side of an external conductive area. When energized will become isolated from each other electrically, and thus, a reference node or potential can be utilized to help conductive substrate 111 and/or its external conductive area if used, an image or ground plane with at least the conductive substrate 111 serving as that function. As a result, circuit energy is able to utilize the filters' ability to provide portions of these propagating electrically differential or electrically complementary energies, the functional ability to condition frequencies of differential and common mode noise, simultaneously. Each set of oppositely positioned, complementary, energy conditioners such as 500A and 500B and 600A and 600B of FIGS. 1 and 2 and their respective differential electrodes, will operate electrically, approximately 180 degrees out of phase to the other during energized operations.

The arrangement of the various energy conditioners that are normally configured in pairs which are isolated from one another be being located on opposite sides of a conductive substrate (such as the version of conductive substrate 111 shown in FIGS. 1 and 2) is unique, in terms of physical arrangement of conventional and prior art elements, as well as what happens during their subsequent energization.

The physical element arrangement, as well as the electrical circuit arrangement includes a state or a condition that is called "opposite sides of an image reference or reference ground." Opposite sides of the conductive substrate 111 refers to both physically opposite in a static state, and will be referred to as an electrically opposite positioning (yet simultaneously neutral to both the energy source and a load using portions of propagating energy utilizing the circuit they are attached to, in an energized state.

The energy conditioner filter structure or assembly comprises a conductive structure 111 that is configured to allow for at least one selective isolation function to be created or operable after this energy conditioning element is mounted with and conductively coupled to the energy conditioners during a non-energized state. The conductive structure 111 will also be operable for an additional, selective isolation function during energized operations. Both selective isolation functions will then carry forward simultaneously, in an energized circuit operation. The selective isolation functions will have energy conditioning effects upon propagating energies that are moving along and/or through the various energy conditioners and the energy conductors that are amalgamated or combined within portions of the conductive structure 111. This concept is a keystone for providing predetermined electrical and physical isolation of complementary energy pathways located both, physically and electrically (when energized) on the opposite side of ground or the conductive substrate.

This conductive substrate 111 also serves as a conductive shielding structure mated with at least the complementary energy conditioners to comprise a grouped, electronic circuit conditioning, assembly that is physically or structurally, symmetrical, and balanced in terms of the conductive structural elements. The capacitance values for each shaped-energy conditioners 500A and 500B or 600A and 600B when the devices are either multilayer or monolithic energy conditioners to not necessarily need to be matched. This feature also allows the user the freedom to pick and choose among various capacitance values, for example per contact pin, while maintaining operability of filter 10 and filter 20, the energy conditioning functions in a complementary, electrically opposing manner.

Thus, it should be noted that it is also not necessarily symmetrical or balanced in terms of the nonconductive elements that when combined with the conductive structural elements to make up a complete isolating energy conditioning shield assembly or energy conditioning shield filter before circuit attachments.

This invention is used to provide a multitude of line conditioning functions Such as, but not limited to providing power and signal line filtering, minimizing cross talk, the availability of at least three isolating energy pathways for circuit connection, a portion of energized circuitry that is practicable for performing simultaneous differential and common mode filtering of power and/or signal lines, a wide ranging filtering characteristic for electromagnetic interference (EMI) protection and/or the ability to provide protection from surge events.

More specifically, this invention includes the ability of the user to have a predetermined and pre-positioned selection opportunity for various energy conditioning element configurations that allow for accommodating relatively high pulse currents without degradation or failure in either a by-pass or feed-through configuration by converging the three distinct and electrically isolated energy propagational pathways within a single filter device amalgamation. An energy conditioning network can be used as part of a power line circuit and formed having a source of energy, at least the filter structure and a load. An energized energy conditioning network will comprise at least two line to ground capacitors and at least one line to line capacitor.

An energized energy conditioning network can also function as a voltage divider. A value of the voltage reference located on the opposing and opposite sides of the common shielding structure will be created at energization and defines a common voltage reference located on or at and instantaneously for both respective sides of the common electrode shield structure. For example in a power entry usage, when the voltage potential across a power and return energy conductors such as 100A and 100B, respectively is a voltage V1, and the potential between these conductors and a common ground is a voltage V2 being approximately half of the voltage V1, by the function of an interposing conductive structure 111 positioned between energy conductors such that conductors 100A and 100B are on the opposite sides of this common ground 111 as the energy conductors them selves are coupled singularly to either the complementary, energy conditioners such as 500A and 500B or 600A and 600B, respectively. Thus, a phase balanced device is easily and economically achieved as only half of the voltage V2 line to line is created verses the V1 voltage found for each isolated (mutually from the other). The energy conditioning network will now have a structure that functions similar to a shielded, center tap voltage divider, which is now processing equal voltage reference in parallel, hence dividing a circuit's voltage in half line to line with respective to the line to ground capacitive values that may be obtained.

The conductive substrate 111 also serves as at least the third energy pathway of the three existing isolating energy pathways to be practicable when the assembly is energized to become the isolated third energy pathway or third conductive energy pathway that will provide portions of propagating energies and energy pathway of least or low impedance, due to the extraordinarily, low inductance created within the filter during energized operations.

This low impedance state, allows portions of energies that are propagating along the remaining two isolated differential energy pathways in most cases, a primary pathway or as an alternative energy pathway, all the while, and at the same time, this third energy pathway will function to block or prevent the similar portions of energies to 'backtrack' back into the energized circuit to cause disruptions. Thus, conductive substrate 111 of the filter like those shown in FIGS. 1 and 2 has the ability to offer a blocking function to portions of energies that have left the assembly's area of convergence (AOC) and is now under the influence of the external common conductive energy pathway from attempting to return.

In other words, the term used in the industry called 'ground bounce' is substantially suppressed. Because the conductive substrate 111 is primarily used as a third conductive energy pathway, it will not normally be electrically connected to either a portion of the first conductive energy pathway 112 (not fully shown) or a portion of the second conductive energy pathway 102 (not fully shown), which are serving as the complementary energy pathways during differential energy operations.

To begin with, the shaped-energy conditioners or shaped-capacitors 500A and 500B and 600A and 600B (as used in this variation) of FIG. 1 and FIG. 2 or the energy conditioners or passive components will now be described. The shaped-capacitors are generally known in the art for their use in a wide range of electronic circuit applications. For example, these uses include, use as charge storage device, a circuit coupling or decoupling device, a filtering device, feed thru, etc. For the multilayer version 500A and 500B, this passive component conventionally comprises a plurality of alternating, or interleaved electrode layers 107 and 108 respectively, that are almost totally encased within in material of predetermined electrical properties 105, most notably a dielectric material 105 in a tubular-shaped appearance containing alternating layers at a predetermined spacing within a predetermined selected conductive casing material or structures 102 and 112, which are the two conductive electrodes that serve as the boundary or conductive casing of a typical energy conditioner structure.

A material of predetermined electrical properties 105 can be formulated to have a selected dielectric constant. In the invention, complementary or, differential electrodes 100A and 100B and common conductive substrate 111 will be connected to appropriate conductive termination points (not shown) or surfaces that include circuit connections(not shown). Conductive terminations are applied to the respective exposed conductive portions or at any appropriate area of the filter energy conditioner elements when placement into circuitry is desired. In addition, in FIG. 1 and FIG. 2 symbol 114 represents continuation of conductive substrate 111. Although not shown, certain conductive terminations or structures may be formed in a host of many known industry possibilities or manners to provide electrical, material coupling or mechanical bonding, conductive coupling, conductive fusing, combined conductive amalgamation of predetermined and selected conductive portions or areas on or within the surface of the invention elements to enable attachment or integration into a circuit for energization. These conductive terminations (not shown) may extend beyond the end margins of a device when surface mounting is desired. Alternative conductive termination methods, including applications of layers of conductive material elements that are compatible with available and future processing technology, can be used.

The present invention overcomes the problems and disadvantages encountered in the prior art by providing an improved circuit conditioning function with a tubular-shaped component containing an embedded electrode layer/plate pattern that is capable of handling significantly higher current loads in certain applications.

All this is accomplished not by requiring a significant increase in the volumetric size, but by modifying attachment to a conductive ground area which becomes a "0" reference ground and low impedance path for cancellation of inductance and noise.

Each energy-conditioning element 500A and 500B and 600A and 600B comprises second conductive portions and first conductive portions or electrode portions 102 and 112, which second conductive portions 102 are available for coupling or contacting to the conductive sleeve 109 of conductive substrate 111 or the energy conductors 100A and 100B, respectively.

Specifically, this is a configuration that will be the converse or opposite or even considered, complementary for elements like the second conductive portions and first conductive portions 102 and 112, with respect to how these isolated conductive portions are related to each other. Isolated second conductive portions 102 serve as the primary conductive contact-coupling element with respective to the solder material 101 to coupling the various energy conductor pins 100"A" and 100"B", respectively, which are located primarily internal within the aperture or cavity (not shown) created in conditioners 500A and 500B and 600A and 600B during their particular manufacturing process. It should be noted that the inserting or hole-making manufacturing processes is not considered part of the invention.

With the addition of conductive solder material 101 or solder reflow material 101, conductive epoxy 101, or any other conductive securing medium commonly known and used in the art of assembling of the tubular-shaped devices 500A and 500B and 600A and 600B with differential conductive pins 100A and 100B for further processing is substantially complete.

Energy conditioners 500A and 500B can be identical in conductive material composition. This potential limitation is different upon the non-conductive passive or inductive materials energy conditioning values that are used to rate or give value to each pin 100's energy conditioning contribution to a specific and circuit portion.

However, regardless of the specific energy conditioning values attributed to tubular-shaped units, it is the conductive elements or metalized conductive structures themselves that are needed to provide the initial and necessary symmetrical balance and complementary physical properties for balanced circuit dynamics.

These balanced conductive elements include the alternating multi-layered electrode plates or layers 107,108, which are comprised of noble metal materials or deposits that are separated by a material 105 with predetermined electrode properties such as a dielectric. Each electrode 107 and 108, undergo application, amalgamation, deposit, fusing or attachment to external conductive portions, which are the second conductive portions and first conductive portions or electrode portions 102 and 112 of each respective energy-conditioning unit. Each energy-conditioning unit 500 comprises at least one hole or aperture practicable for receiving the energy conductor or contact pins 100A and 100B (which are identical), there through. Energy conductor or connector pin 100A and 100B are energy conductors that allow transfer or propagations of energies from an energy source to an energy utilizing load and often require the aid of multiple energy conditioning devices to make the transfer or propagation of these energies more efficient, less noisy, or debilitating. Conductive solder, solder reflow material 101, conductive epoxy, or any other known conductive securing medium 101 is deposited or applied to securely connected as well as fight structural support for contact pins 100A and 100B that are positioned therethrough. Various insulating structures such as band 104 are predetermined and selectively applied or positioned at locations found external to each external electrode 102 and 112 of each energy conditioners 500A and 500B. These insulated bands or applications provide separations between second conductive portions and first conductive portions or electrode portions 102 and 112 so that a capacitance can be developed between all the electrodes connected, respectively to each second conductive portions and first conductive portions or electrode portions 102 and 112. Non-conductive void or band 104 located between outer conductive portions of multi-layer shaped-energy conditioners 500A and 500B or monolithic shaped-energy conditioners 600A and 600B comprises a void or insulation material that provides separation of the electrically conductive second conductive portions and first conductive portions or electrode portions 102 and 112 from each other of multi-layer shaped-energy conditioners 500A and 500B or monolithic shaped-energy conditioners 600A and 600B.

Solder material 101 serves to physically couple isolated first conductive portions 112 to the various energy conductor pins 100"N" and 100"B" in a manner that allows electrical energy to propagate within a circuit. Isolated second conductive portions 102 serve as the primary conductive contact-coupling element with respective to the physical and conductive coupling to sleeve 109, respectively. Conductive sleeves 109 are normally found as complementary elements, that are primarily located either contiguously coupled as a result of the machine operation upon the conductive substrate, thus forming a monolithic substrate that includes the conductive sleeves 109.

Conductive sleeves 109, as illustrated in FIGS. 1 and 2 of the disclosure, are in other cases, separate, discrete elements that are selectively in a predetermined manner coupled to the conductive substrate 111. Conductive substrate 111, is initially manufactured with holes or apertures that are either processed, stamped, or machined, to receive conductive sleeves that are to be conductively coupled to form a integral amalgamation of conductive materials or one, unified conductive structure. It should be noted that discrete or separately applied or coupled sleeves 109 are not necessary, and that certain manufacturing techniques not part of the invention, can allow conductive substrate 111 to be stamped or punched with holes (not shown) created in the form of sleeves 109 and formed continuously or contiguously from the one original stamped metal portion 111. Thus, integral to the substrate are the apertures to be the conductive sleeve or at least to be able to accept the conductive sleeve, conductive energy conditioning holder, conductive eyelet for holding either of multi-layer shaped-energy conditioners 500A and 500B or monolithic shaped-energy conditioners 600A and 600B.

Discrete conductive sleeves or holders 109 are first respectively seated, positioned or located primarily within a pre-positioned hole, aperture or cavity (not fully shown) that was created before mounting of holders 109. With the aid of conductive sleeve lip 113 of holders 109, (which serves in this purpose, as a temporary alignment guide), the primary bonding mechanism, and solder material 101 can easily be applied.

Solder material 101 also serves, in this case, as the primary electrical coupling mechanism that bridges conductive sleeve 109 to conductive substrate 111 for eventually electrical operations.

Various strategically located insulating portions 110 are selectively placed upon or around predetermined portions of conductive substrate 111 to facilitate the conductive amalgamation of conductive sleeve 109 with conductive substrate 111 for the purposes of forming a monolithic conductive substrate structure and to facilitate the concept that each complementary energy conditioning tubular-shaped pair is to be separated between conductive substrate 111 from each other. It should be noted that insulating portions 110 are not always needed as long as the attaching soldering material provides an acceptable amalgamation between the substrate 111 and the conductive sleeves 109.

The physical coupling of isolated conductive portions 102 with conductive sleeve 109 can be accomplished through an interference fit in some cases, and can be also done with conductive epoxy in others, but regardless of the coupling technique used to create physical bonding, the result should allow isolated second conductive portion 102 and conductive sleeve 109, to freely exchange electrical energy as part of a circuit.

Other isolation structures or insulated materials portions shown as 103 and the 104 materials which are located on conditioners 500A and 500B and 600A and 600B are simply nonconductive voids or insulating material banding of insulating material deposits selectively positioned to separate outer isolated second conductive portion 102 of multi-layer shaped-energy conditioner 500A and 500B or monolithic shaped-energy conditioners 600A and 600B from internally located isolated conductive portions 112 of multi-layer shaped-energy conditioners 500A and 500B or monolithic shaped-energy conditioners 600A and 600B.

Thus, with respect to the solder material 101 coupling of the various energy conductor pins 100"A" and 100"B" to either conditioners 500A and 500B and/or conditioners 600A and 600B conditioners, the insulative material 103 deposited or used as insulating filler 103 or "globing" or "goo" can be is applied for the purposes of preventing direct electrical contact between either first conductive portion 112 and second conductive portion 102 as well the purposes of preventing direct electrical contact between second conductive portion 102 and third conductive portions or various energy conductor pins 100"A" and 100"B" which will serve to isolate all of the second conductive portions found on either conditioners 500A and 500B and/or conditioners 600A and 600B from any of the additional conductive portions shown or not shown of any other energy conditioners.

To go further, either energy conductor 100A or 100B of each multi-layer shaped-energy conditioners 500A and 500B or monolithic shaped-energy conditioners 600A and 600B is desired to be coupled for electrical dynamics to the first conductive portion 112 or isolated electrode portion 112 that further comprise assembly 10 of FIG. 1 and assembly 20 of FIG. 2, once again solder material 101 can be used.

Once isolation of the second conductive portion 102 and first conductive portion 112 of both of multi-layer shaped-energy conditioners 500A and 500B and monolithic shaped-energy conditioners 600A and 600B is complete, both portions are now considered to be physically and electrically (when charged) isolated from the other, despite their close proximity.

These complementary electrodes of the shaped-energy conditioners 500 and 600 are now practicable as isolated energy pathways portions of energy conditioners 500 and 600 and are normally identical in conductive material composition as are the energy conductor pin 100"A" and 100"B" that are mated respectively to second conductive portion 102 and first conductive portion 112.

It is noted that identical conductive material composition should not be construed as a limitation with respect to possible heterogeneous mixing of ferro-capacitive energy conditioning structures that could also comprise isolated conductive variant portions of second conductive portion 102 and first conductive portion 112, as this property along with others could be desired and be interchangeable to be operable or practicable filtering solutions depending upon need.

Multi-layer shaped-energy conditioner 500A is paired with another multi-layer shaped-energy conditioner 500B. One of the multi-layer shaped-energy conditioners 500A and 500B is inverted in such a manner as to be turned completely end for end with respect to the other and becomes an opposite mirror of its counterpart. Multi-layer shaped-energy conditioners 500A and 500B comprises material 105 having predetermined electrical properties such as a dielectric material, dielectric material composite, ferro-electrical dielectric material found in both of multi-layer shaped-energy conditioners 500A and 500B or monolithic shaped-energy conditioners 600A and 600B. (shown in FIG. 2). Energy conditioners 500A and 500B contain a plurality of interleaved electrode layers 107 and 108 which are formed in a conventional manner by printing electrode layers 107 and 108 between layers of an unfired or green ceramic material 105, with openings in the electrodes 107, 108 being aligned to form contact openings 104.

Electrode layers 107 form energy return electrodes for the conductive substrate 111 with filter structure 10. Each of electrodes 107 and 108 is connected to a metal strip, (or to multiple strips, layers, coatings or the like) 109 on at least one and preferably all sides of the multi-layer shaped-energy conditioners 500A and 500B to form terminals which can be electrically connected to energy return by any convenient means such as conductive solder 101. In the illustrated embodiment, electrodes 107 and 108 are connected to energy return through layers 102, conductive sleeve structures 109, conductive solder 101 and conductive substrate 111. Those skilled in the art will appreciate that numerous arrangements for connecting external electrodes 102 of a monolithic conductive substrate 111 with filter structure 10 to an energy return are known and that any of them could be substituted for the illustrated energy returning arrangement, which forms no part of the present invention except as noted below.

Numerous filter structures 10 and/or filter structures 20 can be combined into an array of multi-complementary arrangements that can stand alone or be amalgamated into an electrical connector for example. Connectors include D-sub, RJ-45, PC board connectors, as well as ARINC type connectors (all not shown) revealing that the invention is not to be limited to any particular connector configuration. It should be noted that capacitances associated with individual energy conditioners that form an array may be varied. For connecting external electrodes 102 of a monolithic conductive substrate 111 with filter structure 10 to an energy return are known and that any of them could be substituted for the illustrated energy returning arrangement, which forms no part of the present invention except as noted below.

Unlike the prior multi-layer energy conditioners 500A and 500B, the monolithic shaped-capacitors 600A and 600B are arranged to accommodate a dielectric main body 105, a central opening and second conductive portion 102 and first conductive portion 112 within the central opening (not numbered) for receiving differential energy conditioner 100A or 100B.

Moving to FIG. 2, a cross-sectional side view of filter 20 comprised of complementary monolithic energy conditioners arranged in a conductive substrate assembly 20 and located on opposite sides of a grounding configuration now placed in a connector assembly called filter assembly 30 in accordance with the present invention is shown. Rather than repeat the same structural elements again, only the differences and the setting will be discussed in detail.

FIG. 2 illustrates the universal adaptability of the filter as part of a small, differential 2-Pin assembly 30 situated inside filter assembly 30 almost completely encased in insulative potting material 106 or insulating filler material 106 to complete discrete two piece filter assembly 30.

Figure 3:
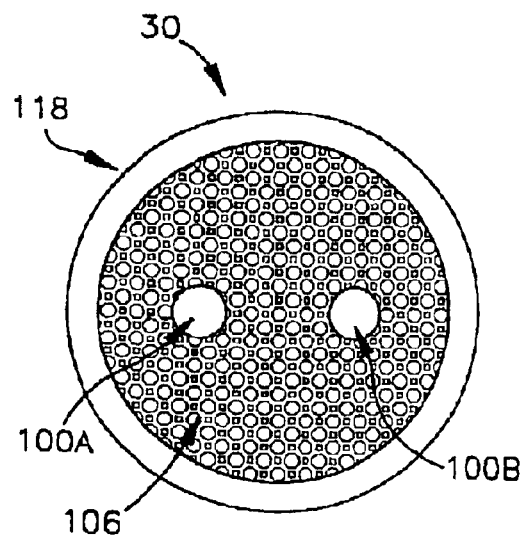
FIG. 3 is a cross-sectional top view of FIG. 2 taken along dotted line "A" showing filter 20 comprising shaped-energy conditioners arranged in a conductive substrate assembly and located on opposite sides of a grounding configuration now placed in a connector assembly called filter assembly 30 in accordance with the present invention.
Figure 4:
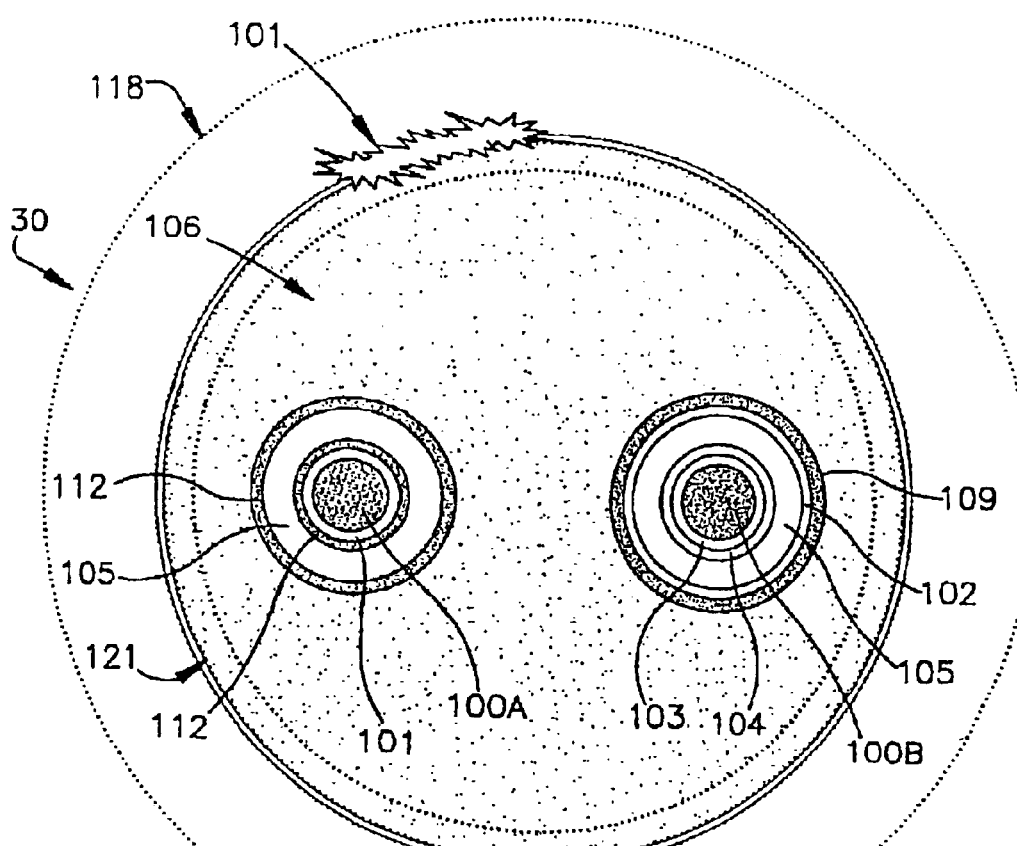
FIG. 4 is a cross-sectional top view of FIG. 2 taken along dotted line "B" showing filter 20 comprising shaped-energy conditioners arranged in a conductive substrate assembly and located on opposite sides of a grounding configuration now placed in a connector assembly called filter assembly 30 in accordance with the present invention.

Turning to FIG. 3 and FIG. 4, two top perspective views of filter 30 are shown. FIG. 3 is showing the top only view of FIG. 2, with no cut away portion, while FIG. 4 is showing a cut away perspective view of FIG. 2 slightly below the top level of filter 30 and monolithic shaped-energy conditioner 600A and 600B contained within filter 30. The outer edge of filter shell body 118 of the filter 30 is shown which contains filter 20 including monolithic shaped-energy conditioner 600A and 600B structures as they are coupled to conductive substrate 111 within filter 30. However, said structures are not shown because 106 insulative potting material or insulating filler material for filter 30 has filled filter 30 and only energy conductor or contact pins 100A and 100B are shown as they project out of insulative potting material or insulating filler material which is contained in assembly 30.

Specifically in FIG. 3, filter shell body 118 of the filter assembly 30 is shown which contains filter 20 within. The entire filter 20 is not shown because insulative potting material or insulating filler material 106 for assembly 30 is filled in this diagram. Filter assembly 30 shows only energy conductors or contact pins 100A and 100B as they are shown projecting Out of insulative potting material 106 (which is removed for explanation purposes in FIG. 4) for further availability for usage in an electrical application.

FIG. 4 is showing an overhead cutaway view of filter 30. Shown are energy conductor pins 100"A" and 100"B" as they project from the filter assembly 30 for allowing propagation of energies to enter or leave filter 20 for eventual conditioning of portions of electrically complementary energies propagating in opposite directions, electrically out of phase with each other in the AOC, simultaneously. Monolithic shaped-energy conditioners 600A and 600B are coupled at predetermined portions to sleeves 109 and then to conductive substrate 111 of filter 20 by solder means 101.

Moving out and away from the third conductive portion or central positioned differential conductor 100B of 600B is insulating material 103, which acts as a spacer between the third conductive portion, or central positioned differential conductor 100B and first conductive portion or external electrode portion 112 of monolithic shaped-energy conditioner 600B.

Non-conductive void or banded insulating material 104 separates physically first conductive portion or external electrode portion 112 from second conductive portion or electrode isolated portion 102 and third conductive portion, or electrode isolated portion, or differential conductors 100B, as does insulating material 103.

Dielectric or supportive material 105 is shown and as stated these 105 materials can be customized to the requirements of the circuit into which the entire assembly is utilized. Second conductive portion or isolated conductive portion or electrode 102 is appears on the outer portion of dielectric or supportive material 105. Second conductive portion or isolated conductive portion or electrode 102 will make conductive coupling contact with conductive sleeve 109, in this case by positioning monolithic shaped-energy conditioner 600B within to a predetermined position for optimal electrical contact. The non-conductive material band 110 can be placed between to separate conductive sleeve 109 from conductive substrate 111, if desired.

Insulative potting material 106 almost totally surrounds conductive energy conditioning holder 109 as shown in the cutaway view. Not shown in FIG. 4 is an optional lip portion 120 of sleeve 109 which is either formed, coupled to or simply an elongated portion at the end of sleeve or holder 109 for preventing slippage of the of multi-layer shaped-energy conditioners 500A and 500B or monolithic shaped-energy conditioner 600A and 600B beyond the pre-selected points of positioning and coupling.

Moving out and away from the central positioned third conductive portion, or central positioned differential conductor 100"A" is conductive solder 101 as it couples third conductive portion, or central positioned differential conductor 100A with the first conductive portion, or external isolated electrode portion 112 of monolithic shaped-energy conditioner 600A.

The first conductive portion, or isolated electrode portion 112 is non-conductively coupled to dielectric or supportive material 105. Isolated portion 112 is placed against dielectric or supportive material 105 for support as it eventually will conductive coupling to substrate 111 by resistive fit, mechanical means or soldering as with conductive solder 101.

It should be noted that second isolated conductive portions 102 on all conditioners 500A and 500B and 600A and 600B are isolated from each respective third conductive portion or external isolated electrode portion 111 and each respective third conductive portion or differential conductors 100"A" and 100"B", respectively in a predetermined manner by non-conductive void or band materials 104, insulation material 103, if needed as well as selective positioning or location of 112 and 102 relative to actual positioning on the energy conditioner units as well and as required to make a proper functioning circuit as is proposed by this invention and is illustrated in FIG. 4.

The illustration shown is by no means meant to limit the other possibilities of achieving the same resulting invention circuitry by other employed methodology. The last area to be shown is the conductive solder 101 as it couples second conductive portion or external electrode portion 102 to conductive substrate 111 to further amalgamate the filter 20 into a single working unit.

Turning back to FIG. 2, this image illustrates that the combined conductive elements that make up the filter 20 and that are further amalgamated by solder 101 to the inside portion of filter shell body 118. Filter shell body 118 contains and is surrounding the 111-substrate assembly holding the shaped devices 600. The filter shell body 118 may also be considered a connector shell or conductive shell in this embodiment and others, in this case having a bushing 116 and the threaded portion 117 of the 118 shell is operable to be considered sandwiching a larger conductive plane or conductive connector holder 115. With the availability of the top portion 119 of the threaded bushing portion 117, this shelf created by the connector structure is adapted and is conveniently used for resting the conductive substrate 111 or holding the conductive substrate 111 for eventual soldering of the mounting to side wall portion 121 and than the 'gooing' with material 106, as well as for additional overall structural support of substrate 111, in the discrete, multi-piece filter 30 application.

Conductive shell 118 in this case is using a threaded bushing 117 that facilitates the sandwiching of conductive plane 115 together with threaded washer or threaded bolt 116 as well, but other forms of connection of the shell can be used and are to numerous to mention.

It is safe to say that filter assembly 30 is interchangeable to as it is related to providing filter 10 or filter 20 accesses to electrical applications and that regardless of the container means used, it is the unique arraignments of the filter 20 with the complementary energy conditioners as they are in relative position to each other on opposite sides of conductive substrate 111 that is very important.

Conductive connection of conductive substrate 111 with shell 118 forms a larger conductive area and in turn enhances the total area as an isolating element for differential conditioning of propagating energies moving along 100A and 100B conductors of either filter 10 or filter 20.

The common conductive attachment of the 102s' which are the second conductive portion of most energy conditioners is also an isolated conductive portion or electrode coupled to the sleeve 109 and will be allowing the shielding function provided by conductive substrate 111 and shell 118 (when used) to be both, a physical shield, as well as to a structure that allows certain propagating portions of propagating energies to be electrically shunted or interposed or electrically separated between each side of conductive substrate 111 and shell 118 (when used), when located at any given point in time along the third conductive portions of units 600 and 500 which are the respective differential conductors, 100A and 100B when coupled to a circuit.

Such three-way energy pathway amalgamation or selective and predetermined circuit coupling as described in this disclosure comprises not only the center common shield structure 111 that will become a neutral voltage reference for a circuit, but other portions of a typical invention circuit which can comprise the following to form an energy conditioning network: an energy source, a first energy pathway connecting from the energy source to third conductive portion or energy conductor pin 100A, of 500A for example, the first energy pathway then continuing through shaped element to first conductive portion 112 of energy conditioner 600 and then onward along a first energy pathway for delivering portions of the propagating energies to an energy utilizing-load.

After portions of energies are utilized by the load, a second energy pathway connecting from the load is found to be connecting to energy conductor pin 100B or third conductive portion of the other complementary energy conditioner 500B which is now electrically on the opposite side of the circuit reference node created by conductive substrate 111's position and attachments and as was done with the complementary tube 500A, portions of propagating energy will pass on along third conductive portion energy conductor pin 100B, while other energy portions move to first conductive portion 112 to will receive or undergo conditioning from second conductive portions 102 which are isolated from first conductive portions 112 and the third conductive portions 102's respect to each portions location on all of multi-layer shaped-energy conditioners 500A and 500B or monolithic shaped-energy conditioner 600A and 600B, as disclosed.

After leaving the AOC or the area of convergence with respect to of multi-layer shaped-energy conditioners 500A and 500B or monolithic shaped-energy conditioner 600A, 600B, and the various portions of energies continue along energy conductor pin 100B's and propagate back to the original energy source.

During this dynamic process of energy propagation along this invention circuit combination, portions of energies will also propagate to first conductive portion or isolated conductive electrode portion 112 from the various coupled third conductive portions, of course. However, other portions of energies will also propagate or form to the second conductive portions or isolated conductive portions 102 (that are isolated from first and third conductive portions) and of which 102 is conductively connected to sleeve 109, which is in turn connected to conductive substrate 111 which provides a function as a third energy pathway. This third energy pathway acts can function as even a larger grounding or shunt pathway or even serve as a circuit reference potential (when circuit is energized), but does not necessarily need to be operated at all as a pathway the back to the energy source from which portions of energies initiated.

Conductive substrate 111, is conductively coupled by conductive attachment material 101 to the inside of filter assembly 30s' filter shell body 118 or housing 118 which in turn, is securely fastened and sandwiching portions of larger conductive substrate 115. Larger conductive substrate 115 can be a third energy pathway end point in and of itself to serve as a final portion of the third energy pathway on its own. On the other hand, larger conductive substrate 115, in this application for example could further be coupled or conductively connected to a chassis ground or even an earth ground (not shown) that acts as even a larger external grounding, energy shunt pathway or even further as circuit reference potential (when circuit is energized), but does not necessarily need to be operated at all as a pathway the back to the energy source from which portions of energies initiated.

Although the principal embodiments and operations of the present invention have been described in detail herein, this disclosure is not to be construed as being limited to the particular illustrative forms disclosed. It will thus become apparent to those skilled in the art that various modifications of the principal embodiments herein can be made without departing from the spirit or scope of the invention as defined by the appended claims, below.

What is claimed:

1. An energy conditioning structure, comprising:
   a shunt structure;
   a first conditioner; and
   a second conditioner;
   wherein said first conditioner and said second conditioner are mutually oriented in a complementary position to one another relative to a position of said shunt structure; and
   wherein said first conditioner, said second conditioner, and said shunt structure are electrically isolated from one another.

2. The energy conditioning structure of claim 1, in which said first conditioner defines a capacitor structure and said second conditioner defines a capacitor structure.

3. The energy conditioning structure of claim 1, in which said first conditioner and said second conditioner are shielded and isolated from each other by said shunt structure.

4. A circuit comprising the energy conditioning structure of claim 1.

5. An energy conditioning network, comprising:
   an energy source;
   a load;
   a conductive shield structure;
   a plurality of capacitors;
   wherein each capacitor of said plurality of capacitors has at least a first portion, a second portion, and a third portion;
   wherein a first capacitor and a second capacitor of said plurality of capacitors are oppositely positioned complementary from one another;
   wherein said first capacitor and said second capacitor are electrically coupled to said shield structure; and
   wherein said first portion of said first capacitor and said first portion of said of second capacitor are electrically isolated and shielded from one another.

6. The energy conditioning network of claim 5, in which each capacitor of said plurality of capacitors is multi-layered.

7. The energy conditioning network of claim 5, in which said energy conditioning network is structured to provide the functions of both energy filtering and surge protection.

8. The energy conditioning network of claim 5, in which said energy conditioning network comprises at least two capacitors connected in a circuit between a line and a ground and at least one capacitor connected between two lines of said circuit.

9. The energy conditioning network of claim 5, in which said energy conditioning network comprises a plurality of bypass capacitors.

10. The energy conditioning network of claim 5, in which said energy conditioning network is in a connector.

11. The energy conditioning network of claim 5, structured to operate as part of an energized power line circuit.

12. The energy conditioning network of claim 10, structured to operate as part of an energized power line circuit; and
wherein said energy conditioning network is in a voltage divider.

13. An energy conditioning structure, comprising:
an energy shunt;
a first conditioner; and
a second conditioner;
wherein said first conditioner and said second conditioner are mutually oriented in a complementary position to one another relative to a position of said energy shunt; and
wherein said first conditioner, said second conditioner, and said energy shunt are electrically isolated from one another.

14. The energy conditioning structure of claim 13, in which said first conditioner and said second conditioner function to provide a substantial capacitance.

15. The energy conditioning structure of claim 13, in which said first conditioner and said second conditioner are shielded and isolated from each other by said energy shunt.

16. A circuit comprising the energy conditioning structure of claim 13.

17. An energy conditioning network comprising:
an energy source;
a load;
a conductor for shielding capacitors from one another;
a plurality of capacitors;
wherein each capacitor of said plurality has at least a first portion, a second portion, and a third portion;
wherein a first capacitor and a second capacitor of said plurality of capacitors are oppositely positioned complementary from one another;
wherein said first and said second capacitor are electrically coupled to said conductor; and
wherein said first portion of said first capacitor and said first portion of said of second capacitor are electrically isolated and shielded from one another.

18. The energy conditioning network of claim 17, in which each capacitor of said plurality of capacitors is multi-layered.

19. The energy conditioning network of claim 17, in which said energy conditioning network comprises an energy filter and a surge protector.

20. A circuit comprising the energy conditioning network of claim 17, in which said energy conditioning network comprises at least two capacitors each of which is connected between a line and a ground, and said energy conditioning network comprises at least a third capacitor connected between two lines.

21. The energy conditioning network of claim 17, in which said energy conditioning network comprises a plurality of bypass capacitors.

22. The energy conditioning network of claim 17, in which said energy conditioning network comprises a connector.

23. The energy conditioning network of claim 17, in which said energy conditioning network is structured so that it is operable as part of an energized power line circuit.

24. The energy conditioning network of claim 22, in which said energy conditioning network is structured so that it is operable as of an energized power line circuit; and
wherein said energy conditioning network is in a voltage divider.

25. A method of using an energy conditioning structure, comprising:
shunting energy with an energy shunt;
orienting a first conditioner and a second conditioner mutually in a complementary position to one another relative to a position of said energy shunt; and
wherein said first conditioner, said second conditioner, and said energy shunt are electrically isolated in said energy conditioning structure from one another.

26. A method of energy conditioning, comprising:
providing a source and a load;
providing a plurality of capacitors;
shielding at least a first portion of a first one of said plurality of capacitors from a first portion of a second one of said plurality of capacitors with a conductive shield structure;
wherein said first portion of said first one of said plurality of capacitor is electrically isolated from said first portion of said second one of said plurality of capacitors.

27. An energy conditioning structure, comprising:
a means for shunting energy;
a first conditioner and a second conditioner mutually oriented in a complementary position to one another relative to a position of said means for shunting energy; and
wherein the first conditioner, the second conditioner, and the means for shunting energy are electrically isolated from one another.

28. The structure of claim 1 wherein said shunt structure includes a shunt structure adjacent region, said shunt structure adjacent region being adjacent said first conditioner and said second conditioner, said shunt structure adjacent region defining a shunt structure adjacent region upper surface and a shunt structure adjacent region lower surface.

29. The structure of claim 28 wherein:
said first conditioner comprises a first capacitive structure including a first capacitive structure conductive element, and a conductive path that electrically contacts said first capacitive structure conductive element to a location on said shunt structure adjacent region upper surface, there being no conductive path from said first capacitive structure conductive element to said shunt structure adjacent region lower surface that does no pass through said location on said shunt structure adjacent region upper surface; and
said second conditioner comprises a second capacitive structure including a second capacitive structure conductive element, and a conductive path that electrically contacts said second capacitive structure conductive element to a location on said shunt structure adjacent region lower surface, there being no conductive path from said second capacitive structure conductive element to said shunt structure adjacent region upper surface that does no pass through said location on said shunt structure adjacent region lower surface.

30. An energy conditioning structure, comprising:

a shunt structure having a shunt structure adjacent region, said shunt structure adjacent region having a shunt structure adjacent region upper surface and a shunt structure adjacent region lower surface;

a first conditioner having a first conductive path passing through said shunt structure adjacent region;

a second conditioner having a second conductive path passing through said shunt structure adjacent region;

said first conditioner comprising a first conditioner first capacitive structure and a first conditioner conductive path;

wherein said first capacitive structure includes a first capacitive structure conductive element;

wherein said first conditioner conductive path electrically contacts said first capacitive structure conductive element to a location on said shunt structure adjacent region upper surface, and there is no conductive path from said first capacitive structure conductive element to said shunt structure adjacent region lower surface that does not pass through said location on said shunt structure adjacent region upper surface;

said second conditioner comprising a second conditioner second capacitive structure and a second conditioner conductive path;

wherein said second capacitive structure includes a second capacitive structure conductive element; and wherein said second conditioner conductive path electrically contacts said second capacitive structure conductive element to a location on said shunt structure adjacent region lower surface, and there is no conductive path from said second capacitive structure conductive element to said shunt structure adjacent region upper surface that does not pass through said location on said shunt structure adjacent region lower surface.

31. A method of making an energy conditioning structure, comprising:

providing a shunt structure having a shunt structure adjacent region, said shunt structure adjacent region having a shunt structure adjacent region upper surface and a shunt structure adjacent region lower surface;

providing a first conditioner having a first conductive path passing through said shunt structure adjacent region;

providing a second conditioner having a second conductive path passing through said shunt structure adjacent region;

said first conditioner comprising a first conditioner first capacitive structure and a first conditioner conductive path;

wherein said first capacitive structure includes a first capacitive structure conductive element;

wherein said first conditioner conductive path electrically contacts said first capacitive structure conductive element to a location on said shunt structure adjacent region upper surface, and there is no conductive path from said first capacitive structure conductive element to said shunt structure adjacent region lower surface that does not pass through said location on said shunt structure adjacent region upper surface;

said second conditioner comprising a second conditioner second capacitive structure and a second conditioner conductive path;

wherein said second capacitive structure includes a second capacitive structure conductive element; and wherein said second conditioner conductive path electrically contacts said second capacitive structure conductive element to a location on said shunt structure adjacent region lower surface, and there is no conductive path from said second capacitive structure conductive element to said shunt structure adjacent region upper surface that does not pass through said location on said shunt structure adjacent region lower surface.

32. A method of using an energy conditioning structure, said energy conditioning structure comprising:

a shunt structure having a shunt structure adjacent region, said shunt structure adjacent region having a shunt structure adjacent region upper surface and a shunt structure adjacent region lower surface;

a first conditioner having a first conductive path passing through said shunt structure adjacent region;

a second conditioner having a second conductive path passing through said shunt structure adjacent region;

said first conditioner comprising a first conditioner first capacitive structure and a first conditioner conductive path;

wherein said first capacitive structure includes a first capacitive structure conductive element;

wherein said first conditioner conductive path electrically contacts said first capacitive structure conductive element to a location on said shunt structure adjacent region upper surface, and there is no conductive path from said first capacitive structure conductive element to said shunt structure adjacent region lower surface that does not pass through said location on said shunt structure adjacent region upper surface;

said second conditioner comprising a second conditioner second capacitive structure and a second conditioner conductive path;

wherein said second capacitive structure includes a second capacitive structure conductive element; and wherein said second conditioner conductive path electrically contacts said second capacitive structure conductive element to a location on said shunt structure adjacent region lower surface, and there is no conductive path from said second capacitive structure conductive element to said shunt structure adjacent region upper surface that does not pass through said location on said shunt structure adjacent region lower surface, said method comprising:

conditioning energy with said energy conditioning structure.

* * * * *